United States Patent
Yanagawa (10) Patent No.: US 6,535,410 B2
(45) Date of Patent: Mar. 18, 2003

(54) CONTENT ADDRESSABLE MEMORY DEVICE WITH REDUCED POWER CONSUMPTION

(75) Inventor: Miki Yanagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/080,561

(22) Filed: Feb. 25, 2002

(65) Prior Publication Data

US 2002/0181264 A1 Dec. 5, 2002

(30) Foreign Application Priority Data

May 30, 2001 (JP) ........................................ 2001-163253

(51) Int. Cl.[7] .............................................. G11C 15/00
(52) U.S. Cl. .......................................... 365/49; 365/203
(58) Field of Search ........................... 365/49, 203, 202, 365/204

(56) References Cited

U.S. PATENT DOCUMENTS 6,191,969 B1 * 2/2001 Pereira ........................ 365/49
6,477,071 B1 * 11/2002 Edman et al. ................ 365/49

* cited by examiner

Primary Examiner—Tan T. Nguyen
(74) Attorney, Agent, or Firm—Arent Fox Kintner Plotkin & Kahn, PLLC

(57) ABSTRACT

A content addressable memory device includes a first match line which is a first one of two portions into which a whole match line corresponding to a single item of entry data is divided, and changes from a first potential to a second potential when corresponding entry data does not match an entry key, a second match line which is a second one of the two portions into which the whole match line corresponding to the single item of entry data is divided, and changes from a second potential to a first potential when corresponding entry data does not match an entry key, a first precharge circuit which precharges the first match line to the first potential, a second precharge circuit which precharges the second match line to the second potential, and a short-circuiting circuit which short-circuits the first match line and the second match line with each other prior to precharging by the first and second precharge circuits if both of the first and second match lines indicate a mismatch.

8 Claims, 9 Drawing Sheets

ML SHORT-CIRCUITING
CONTROL SIGNAL

FIG.9

ML SHORT-CIRCUITING
TIMING SIGNAL

CONTENT ADDRESSABLE MEMORY DEVICE WITH REDUCED POWER CONSUMPTION

BACKGROUND OF THE INVENTION

1. Field of the Invention

The present invention generally relates to semiconductor memory devices, and particularly relates to a content addressable memory.

2. Description of the Related Art

A Content addressable memory (CAM) is a memory device that receives data as an input, and outputs an address. A CAM detects data that matches input data within a memory area, and outputs an address at which the matched data is stored. The input data is referred to as an entry key, and the stored data are called entry data.

Figure 1:
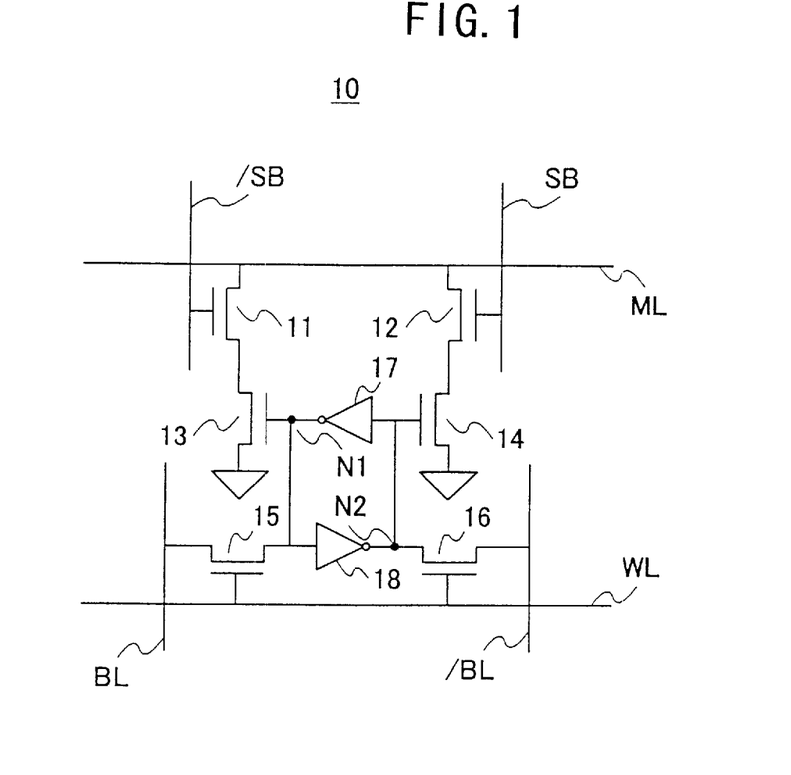
FIG. 1 is an example of a cell used in a CAM.

FIG. 1 is an example of a cell used in a CAM.

A CAM cell 10 of FIG. 1 includes NMOS transistors 11 through 16 and inverters 17 and 18. The inverters 17 and 18 together form a latch that stores therein one bit data. When the CAM cell 10 stores "1" therein, the data is latched such that a node N1 and a node N2 are "1" and "0", respectively. When the CAM cell 10 stores "0" therein, the data is latched such that the node N1 and the node N2 are "0" and "1", respectively. The storing of data is carried out by supplying the data to bit lines BL and /BL and activating a word line WL.

An entry key is provided through a search bus SB and /SB. When the entry key is "1", the search bus lines SB and /SB are "1" and "0", respectively. When the entry key is "0", the search bus lines SB and /SB are "0", and "1", respectively.

In an initial state, a match line ML is precharged to HIGH. An entry key is then supplied to the CAM cell 10 through the search bus SB and /SB. If a 0/1 data combination of the search bus SB and /SB matches a 0/1 data combination of the entry data stored in the CAM cell 10, the match line ML stays HIGH. If they do not match, the NMOS transistors 11 and 13 simultaneously become conductive, or the NMOS transistors 12 and 14 simultaneously become conductive, so that the match line ML is coupled to the ground to become LOW.

A plurality of CAM cells identical to the CAM cell 10 as described above are provided to store entry data comprised of a plurality of bits, and are connected to the same match line ML in parallel. This provision makes it possible to check a match/mismatch status of an entry key comprised of a plurality of bits.

Figure 2:
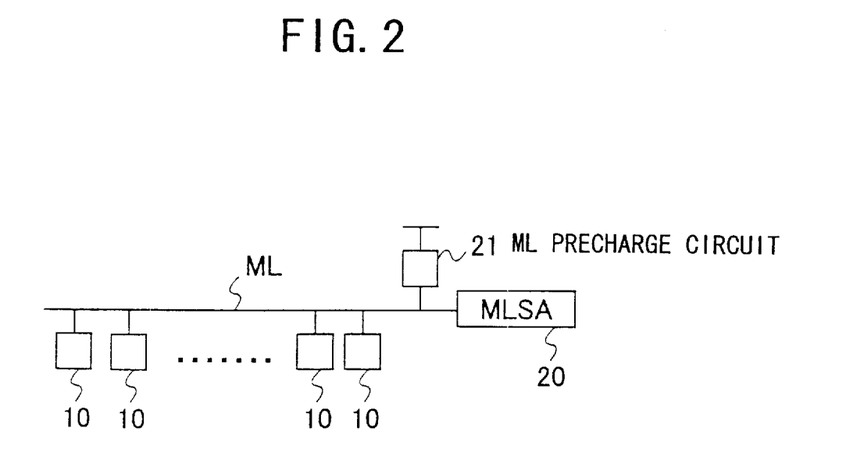
FIG. 2 is an illustrative drawing showing a configuration in which a plurality of CAM cells are connected to a common match line.

FIG. 2 is an illustrative drawing showing a configuration in which a plurality of CAM cells 10 are connected to a common match line.

As shown in FIG. 2, a plurality of CAM cells 10 are connected to the same match line ML. If any one of the CAM cells 10 does not match an entry key, i.e., if there is a difference of even a single bit between the entry data and the entry key, the match line ML that has been precharged to HIGH in the initial state is coupled to the ground to be pulled down. If the entry data and the entry key match, the match line ML stays HIGH.

The match line ML is connected to a match line sense amplifier (MLSA) 20 and a match line precharge circuit 21. The match line sense amplifier 20 is mainly comprised of a differential amplifier, and detects the signal level of the match line ML by comparing the potential of the match line ML with a reference potential. The match line precharge circuit 21 precharges the match line ML to a HIGH potential after the data detection by the match line sense amplifier 20. This completes preparation for a next data search.

Figure 3:
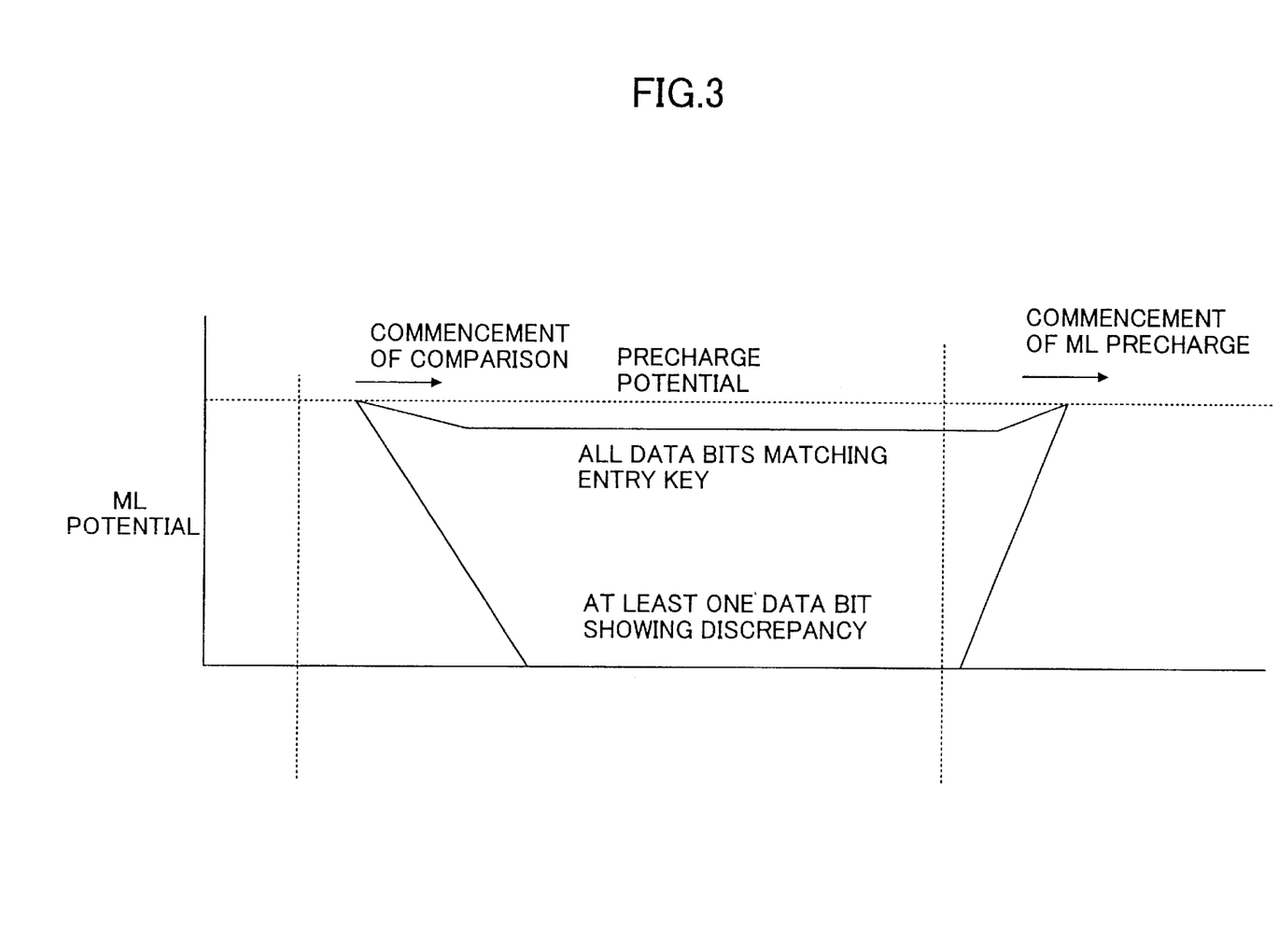
FIG. 3 is a drawing showing voltage changes of the match line at the time of a data search.

FIG. 3 is a drawing showing voltage changes of the match line ML at the time of a data search.

As shown in FIG. 3, when a data search starts by comparing entry data with an entry key, the potential of the match line ML is brought down to the ground potential in the case of a data mismatch. In the case of a data match, however, the potential of the match line ML exhibits almost no change from the precharge potential. After the data detection by the match line sense amplifier 20, the match line precharge circuit 21 starts a precharge operation. Through this operation, the potential of the match line ML is set to the precharge potential.

In content addressable memory devices, a plurality of match lines are provided, and comparison of an entry key with entry data is made separately for each match line. That is, the entry key supplied through the search bus is compared on a bit-by-bit basis with entry data represented by a plurality of CAM cells sharing the same match line, and such comparison is made with respect to each match line. The potential of each match line changes according to a match or mismatch status of each data.

If there is more than one match line showing a data mismatch, therefore, there is more than one match line that is brought down to the ground potential. Precharging all the match lines that have been brought down to the ground potential requires a large electric power, resulting in large power consumption in the content addressable memory devices.

Accordingly, there is a need for a content addressable memory device in which power consumption is reduced with respect to precharging operations.

SUMMARY OF THE INVENTION

It is a general object of the present invention to provide a content addressable memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a content addressable memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a content addressable memory device according to the present invention includes a first match line which is a first one of two portions into which a whole match line corresponding to a single item of entry data is divided, and changes from a first potential to a second potential when corresponding entry data does not match an entry key, a second match line which is a second one of the two portions into which the whole match line corresponding to the single item of entry data is divided, and changes from a second potential to a first potential when corresponding entry data does not match an entry key, a first precharge circuit which precharges the first match line to the first potential, a second precharge circuit which precharges the second match line to the second potential, and a short-circuiting circuit which short-circuits the first match line and the second match line with each other prior to precharging by the first and second precharge circuits if both of the first and second match lines indicate a mismatch.

In the content addressable memory device as described above, the first match line is precharged from the midlevel potential following the short-circuiting to the first potential, and the second match line is precharged from the midlevel potential following the short-circuiting to the second potential. When the first and second potentials are HIGH and LOW potentials, respectively, precharging of the second match line is performed by simply discharging electric charge stored in the wire capacitance of the match line, and does not need any power supplied from the exterior of the content addressable memory device. Accordingly, electric power that is required for the precharging operation is equal to the electric power that precharges the first match line from the midlevel potential to the HIGH potential. This is a quarter of the power required in a conventional configuration in which a match line twice as long is precharged from the ground potential to the HIGH potential.

In reality, since some of the match lines are precharged to the LOW potential in the present invention, additional power is required in the case of a data mismatch in order to bring up a match line from the ground potential to a HIGH potential such as the power supply potential by supplying power from a CAM cell. Since precharging to LOW is performed with respect to the second match line, the second match line needs to be pulled up from LOW to HIGH at the time of a mismatch determination. This requires half as much the electric power as required in the conventional precharge operation that precharges a match line twice as long from the LOW potential to the HIGH potential.

Accordingly, the configuration of the present invention completes one cycle of operations from a match/mismatch check to a precharge operation by spending ¾ of the electric power that is required for the conventional precharge operation where ¾ of the electric power is a sum of ¼ of the electric power for a precharge operation and ½ of the electric power for a match/mismatch check. Even if no short-circuiting is performed because only one of the paired match lines exhibits a mismatch, pulling up one of the match lines from LOW to HIGH at the time of a precharge operation or a mismatch determination involves only half the capacitance load of a conventional match line, thereby requiring only ½ of the conventionally required electric power.

According to another aspect of the present invention, a method of precharging a content addressable memory includes the steps of precharging a first match line to a first potential, the first match line corresponding to a first portion of entry data, precharging a second match line to a second potential, the second match line corresponding to a second portion of the entry data, changing the first match line from the first potential to the second potential in response to a mismatch between a first portion of an entry key and the first portion of the entry data, changing the second match line from the second potential to the first potential in response to a mismatch between a second portion of the entry key and the second portion of the entry data, short-circuiting the first match line and the second match line with each other if the first match line is at the second potential and the second match line is at the first potential, precharging to the first potential the first match line that is at a midlevel potential between the first potential and the second potential after the short-circuiting, and precharging to the second potential the second match line that is at the midlevel potential after the short-circuiting.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 4:
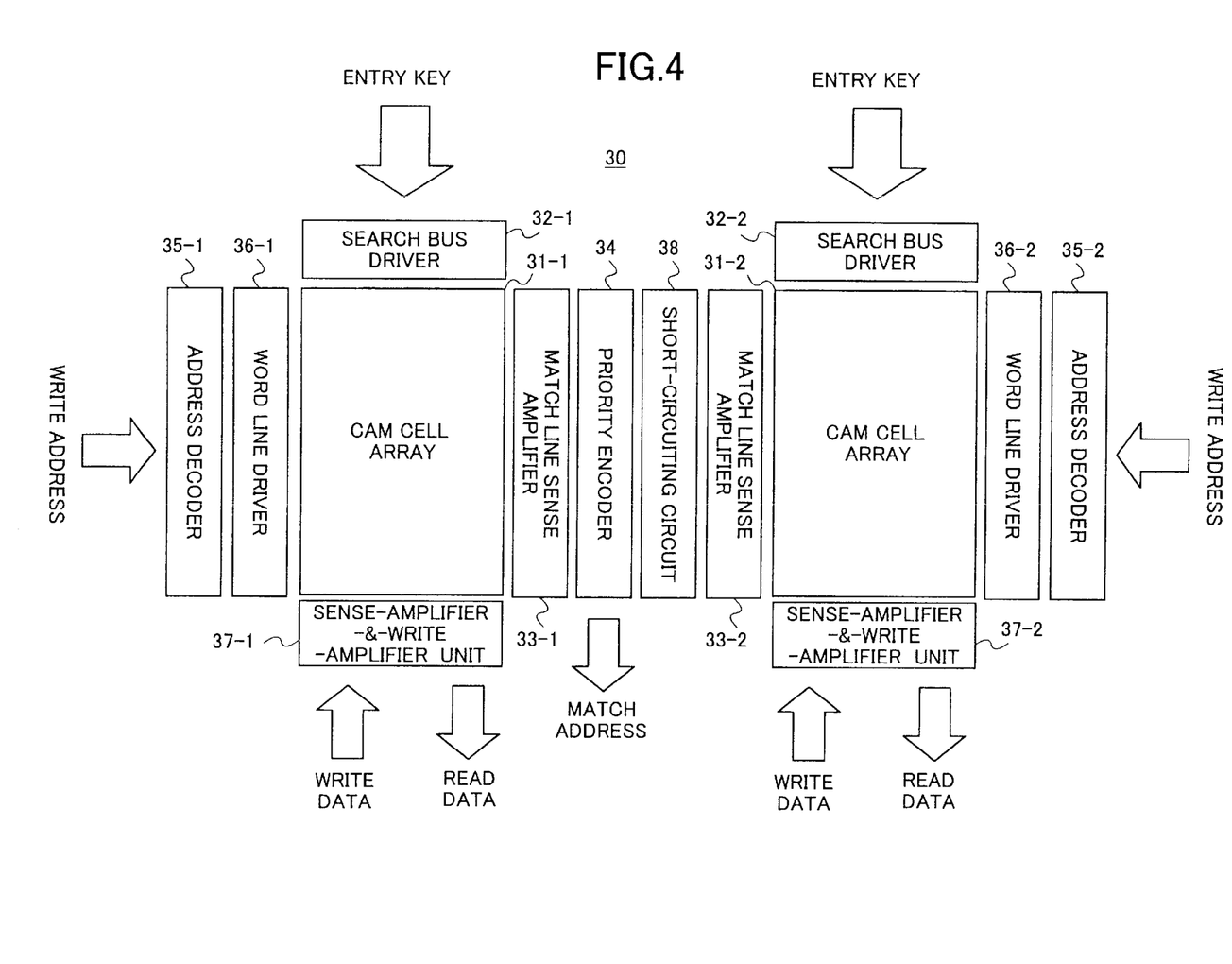
FIG. 4 is a block diagram of a content addressable memory device according to the present invention.

FIG. 4 is a block diagram of a content addressable memory device according to the present invention.

A content addressable memory device 30 of FIG. 4 includes CAM cell arrays 31-1 and 31-2, search bus drivers 32-1 and 32-2, a match line sense amplifiers 33-1 and 33-2, a priority encoder 34, address decoder 35-1 and 35-2, word line drivers 36-1 and 36-2, sense-amplifier-&-write-amplifier units 37-1 and 37-2, and a short-circuiting circuit 38. In the present invention, a CAM cell array is divided by half in a direction in which match lines extend, thereby providing the two CAM cell arrays 31-1 and 31-2. In accordance with this division, two sets of each circuit unit are provided, except for the priority encoder 34 and the short-circuiting circuit 38. If entry data is 32 bits long, for example, 16 bits that is half of the entire data length are stored in the CAM cell array 31-1, and the remaining 16 bits are stored in the CAM cell array 31-2. Namely, the CAM cell arrays 31-1 and 31-2 are combined together to represent the entire entry data.

Figure 5:
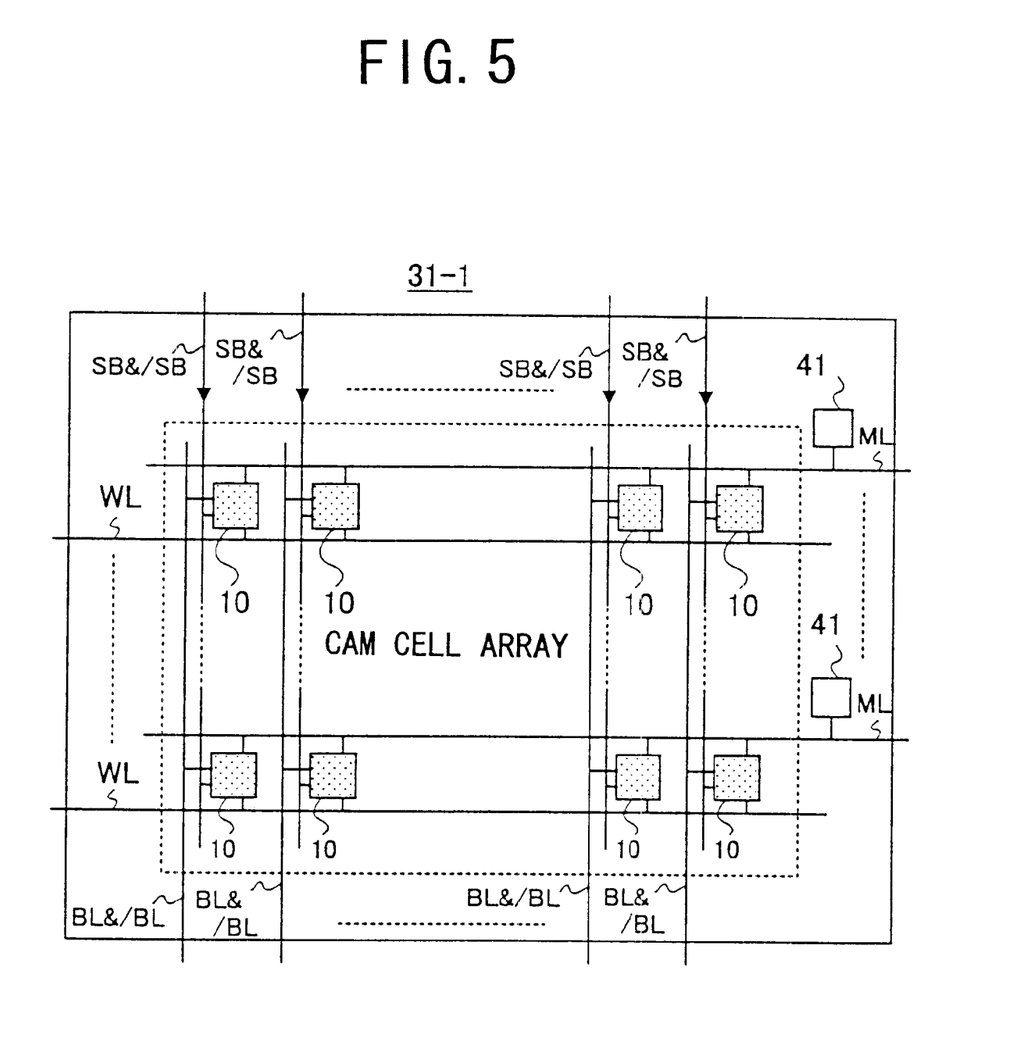
FIG. 5 is a circuit diagram showing an example of a CAM cell array.

FIG. 5 is a circuit diagram showing an example of the CAM cell array 31-1.

As shown in FIG. 5, the CAM cell array 31 includes a plurality of CAM cells 10 identical to the CAM cell 10 of FIG. 1 arranged in a matrix form. Each of the CAM cells 10 is connected to a search bus SB and /SB extending from the search bus driver 32-1, a word line WL extending from the word line driver 36-1, and bit lines BL and /BL extending from the sense-amplifier-&-write-amplifier unit 37-1. A plurality of the CAM cells 10 connected to the same word line WL share the same match line ML, which is connected to the match line sense amplifier 33-1. The match lines ML are precharged to a predetermined precharge potential by match line precharge circuits 41.

The CAM cell array 31-2 has CAM cells thereof arranged in a matrix form in the same manner as in the CAM cell array 31-1 shown in FIG. 5. However, a configuration of each CAM cell is different from the configuration of the CAM cell 10 shown in FIG. 1.

Figure 6:
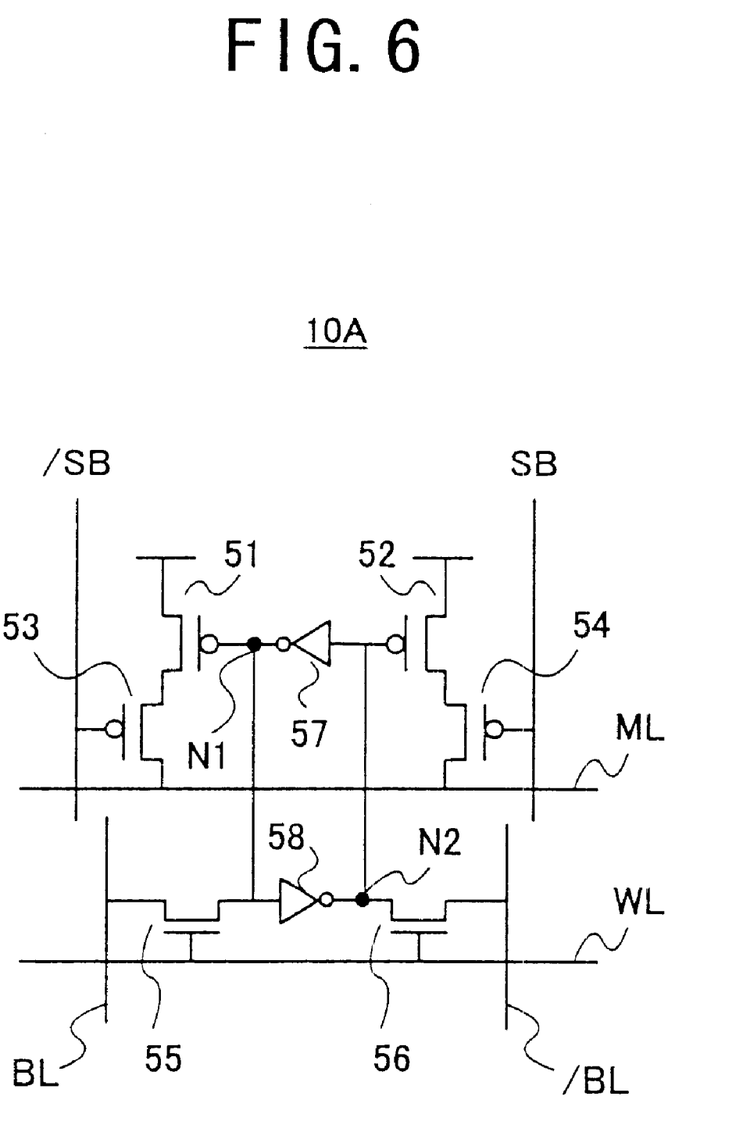
FIG. 6 is a circuit diagram showing a configuration of CAM cells employed in another CAM cell array.

FIG. 6 is a circuit diagram showing a configuration of CAM cells employed in the CAM cell array 31-2.

A CAM cell 10A of FIG. 6 includes PMOS transistors 51 through 54, NMOS transistors 55 and 56, and inverters 57 and 58. The inverters 57 and 58 together form a latch that stores therein one bit data. When the CAM cell 10A stores "1" therein, the data is latched such that a node N1 and a node N2 are "1" and "0", respectively. When the CAM cell 10A stores "0" therein, the data is latched such that the node N1 and the node N2 are "0" and "1", respectively. The storing of data is carried out by supplying the data to bit lines BL and /BL and activating a word line WL.

An entry key is provided through a search bus SB and /SB. When the entry key is "1", the search bus lines SB and /SB are "1" and "0", respectively. When the entry key is "0", the search bus lines SB and /SB are "0" and "1", respectively.

In an initial state, a match line ML is precharged to LOW (e.g., the ground potential). An entry key is then supplied to the CAM cell 10A through the search bus SB and /SB. If a 0/1 data combination of the entry key supplied through the search bus SB and /SB matches a 0/1 data combination of the entry data stored in the CAM cell 10A, the match line ML stays LOW. If they do not match, the PMOS transistors 51 and 53 simultaneously become conductive, or the PMOS transistors 52 and 54 simultaneously become conductive, so that the match line ML is coupled to the HIGH potential of the power supply, for example, to become HIGH.

In this manner, the CAM cell array 31-1 is comprised of the CAM cells 10 of such a type that the match lines ML are precharged to HIGH and brought down to LOW at the time of a mismatch, whereas the CAM cell array 31-2 is comprised of the CAM cells 10A of such a type that the match lines ML are precharged to LOW and brought up to HIGH at the time of a mismatch.

With reference to FIG. 4 again, the search bus drivers 32-1 and 32-2 drive the search buses according to an entry key entered from an exterior of the device. The entry key supplied through the search buses is compared on a bit-by-bit basis with entry data stored in the plurality of the CAM cells 10 and 10A sharing the same match line ML in the CAM cell arrays 31-1 and 31-2. This comparison is performed separately for each of the lines corresponding to the respective match lines ML. When a data match/mismatch is determined on a match-line-specific basis, the potential of each match line ML changes accordingly. In the CAM cell array 31-1, the match line ML is pulled down to LOW if the data does not match, and stays HIGH if the data matches. In the CAM cell array 31-2, the match line ML is pulled up to HIGH if the data does not match, and stays LOW if the data matches.

The match line sense amplifiers 33-1 and 33-2 detect and latch the signals of the match lines supplied from the CAM cell arrays 31-1 and 31-2, respectively, and supply the detected and latched signals to the priority encoder 34. The priority encoder 34 encodes addresses corresponding to the matched match lines for which data match is found in both the CAM cell arrays 31-1 and 31-2, and supplies the address of the highest priority match data to an exterior of the device.

In ordinary semiconductor memory devices, a data output is uniquely determined with respect to an address input. In a CAM, however, there may be a case in which more than one entry data (stored data) matches an entry key (input data), so that the detection of a data match may not be sufficient to uniquely determine a data output. As a precaution against such a situation, the order of priority is determined in advance for each entry data inside the CAM, and the address of the highest priority entry data is output in the event that more than one entry data matches. The priority encoder 34 shown in FIG. 4 is provided for this purpose, and outputs the address of the match line corresponding to the smallest address, for example, as the address of the highest priority match data to the exterior of the device if more than one match line exhibits a data match.

The address decoders 35-1 and 35-2 decode the write address supplied from the exterior of the device, and supply the decoded results to the word line drivers 36-1 and 36-2, respectively. According to the decoded results, each of the word line drivers 36-1 and 36-2 selectively activates a word line WL that corresponds to the input address. The sense-amplifier-&-write-amplifier units 37-1 and 37-2 amplify the write data supplied from the exterior of the device, and supply the amplified data to the CAM cell arrays 31-1 and 31-2, respectively, via the bit lines. The data supplied through the bit lines are stored in the CAM cells 10 and 10A connected to the activated word line WL. Data stored in the CAM cells 10 and 10A can be read from the CAM cell arrays 31-1 and 31-2, respectively, in the same manner as in a read operation of an ordinary memory device, followed by being amplified by the sense-amplifier-&-write-amplifier units 37-1 and 37-2, respectively, to be output to the exterior of the device.

The short-circuiting circuit 38 connects together match lines corresponding to the same word line to effect short-circuiting therebetween if these match lines exhibit a mismatch in both of the CAM cell arrays 31-1 and 31-2. In the CAM cell array 31-1, a mismatched match line becomes LOW, whereas in the CAM cell array 31-2, a mismatched match line becomes HIGH. When the short-circuiting circuit 38 short-circuits the mismatched match lines with each other, these match lines are set equal to a midlevel potential. This midlevel potential is approximately half the precharge potential. Since these match lines are at the midlevel potential after the short-circuiting operation, all that is necessary for a next precharge operation is to discharge one of them to LOW and to precharge the other from the midlevel to the HIGH precharge potential. Accordingly, power consumption in the precharging operation can be significantly reduced in comparison with a conventional case in which a match line that is twice as long is precharged from the ground potential to the HIGH potential.

Figure 7:
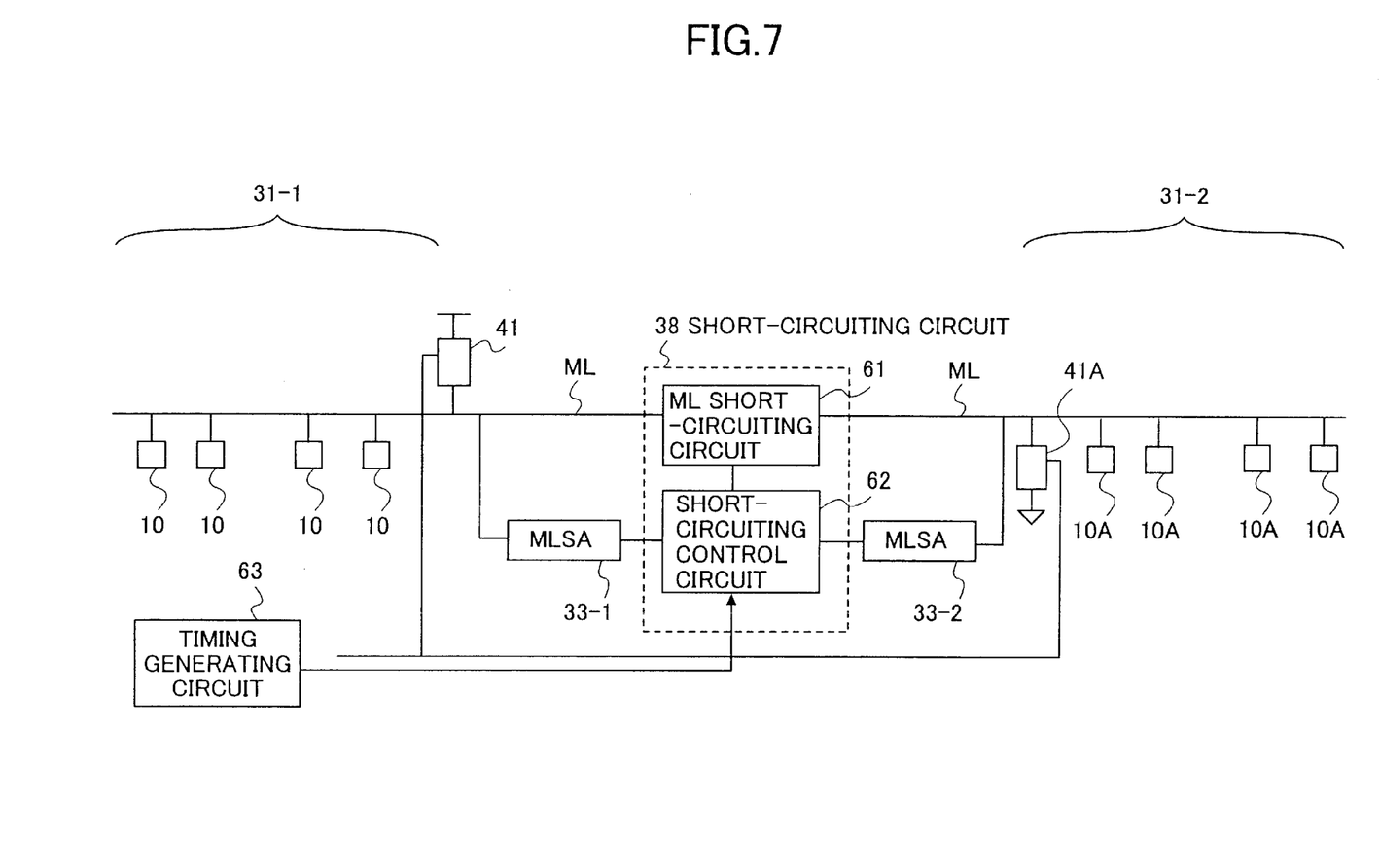
FIG. 7 is a block diagram showing a short-circuiting circuit and relevant configurations surrounding the circuit.

FIG. 7 is a block diagram showing the short-circuiting circuit and relevant configurations surrounding the circuit. FIG. 7 only shows a configuration that relates to a single match line corresponding to a single item of entry data. In an actual circuit configuration, the configuration shown in FIG. 7 is provided for each one of a plurality of match lines.

As shown in FIG. 7, the short-circuiting circuit 38 includes an ML short-circuiting circuit 61 and a short-circuiting control circuit 62. The short-circuiting control circuit 62 drives the ML short-circuiting circuit 61 according to the match/mismatch statuses indicated by the match line sense amplifiers 33-1 and 33-2. Driving of the ML short-circuiting circuit 61 is initiated at proper timing according to a timing signal supplied from a timing generating circuit 63. In detail, if the match line sense amplifiers 33-1 and 33-2 exhibit mismatches in both of the CAM cell arrays 31-1 and 31-2, the ML short-circuiting circuit 61 is driven at the timing corresponding to the timing signal supplied from the timing generating circuit 63. Driven by the short-circuiting control circuit 62, the ML short-circuiting circuit 61 short-circuits a match line ML of the CAM cell array 31-1 (on the left-hand side of the figure) with a match line ML of the CAM cell array 31-2 (on the right-hand side of the figure).

In the CAM cell array 31-1, a mismatched match line ML is brought down to LOW. In the CAM cell array 31-2, on the other hand, a mismatched match line ML is brought up to HIGH. Accordingly, short-circuiting of match lines by the ML short-circuiting circuit 61 of the short-circuiting circuit 38 places both of the match lines ML at the midlevel potential.

In the CAM cell array 31-1, the match line precharge circuit 41 precharges the match line ML from the midlevel potential (e.g., half the precharge potential) to the HIGH potential. In the CAM cell array 31-2, a match line precharge circuit 41A precharges (discharges) the match line ML from the midlevel potential to the LOW potential. Discharging in the CAM cell array 31-2 is performed by discharging electric charge stored in the wire capacitance of the match line ML, and does not need any power supplied from the exterior of the content addressable memory device. Accordingly, electric power that is required for the precharging operation is equal to the electric power that precharges the match line ML from the midlevel potential to the HIGH potential in the CAM cell array 31-1. This is a quarter of the power required in a conventional configuration in which a match line twice as long is precharged from the ground potential to the HIGH potential.

In reality, since the match lines ML are precharged to the LOW potential such as the ground potential in the present invention, additional power is required in the case of a data mismatch in order to bring up a match line ML from the ground potential to a HIGH potential such as the power supply potential by supplying power from a CAM cell. Since precharging to LOW is performed in the CAM cell array 31-2, only the CAM cell array 31-2 needs to pull up the match lines ML to HIGH at the time of mismatch determination. Raising a match line ML from LOW (e.g., the ground potential) to HIGH in the CAM cell array 31-2 requires half as much the electric power as required in the conventional precharge operation that precharges a match line twice as long from the LOW potential to the HIGH potential.

Accordingly, the configuration of the present invention completes one cycle of operations from a match/mismatch check to a precharge operation by spending ¾ of the electric power that is required for the conventional precharge operation where ¾ of the electric power is a sum of ¼ of the electric power for a precharge operation and ½ of the electric power for a match/mismatch check. Even if no short-circuiting is performed because only one of the paired match lines exhibits a mismatch, pulling up one of the match lines from LOW to HIGH at the time of a precharge operation or a mismatch determination involves only half the capacitance load of a conventional match line, thereby requiring only ½ of the conventionally required electric power.

Figure 8:
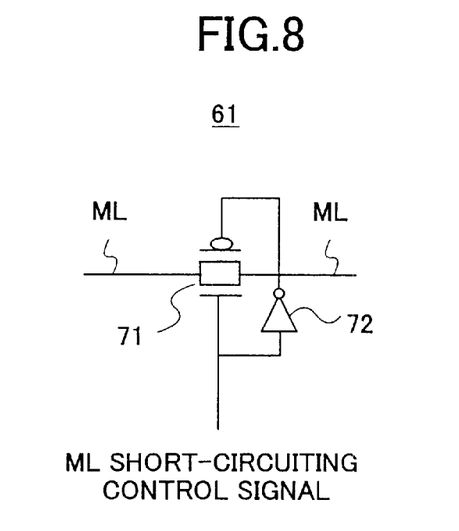
FIG. 8 is a circuit diagram of a circuit configuration of an ML short-circuiting circuit.

FIG. 8 is a circuit diagram of a circuit configuration of the ML short-circuiting circuit 61.

As shown in FIG. 8, the ML short-circuiting circuit 61 includes a transfer gate 71 comprised of a PMOS transistor and an NMOS transistor, and includes an inverter 72. As the ML short-circuiting control signal supplied from the short-circuiting control circuit 62 becomes HIGH, the transfer gates 71 becomes conductive, thereby short-circuiting the match lines ML between the CAM cell array 31-1 and the CAM cell array 31-2.

Figure 9:
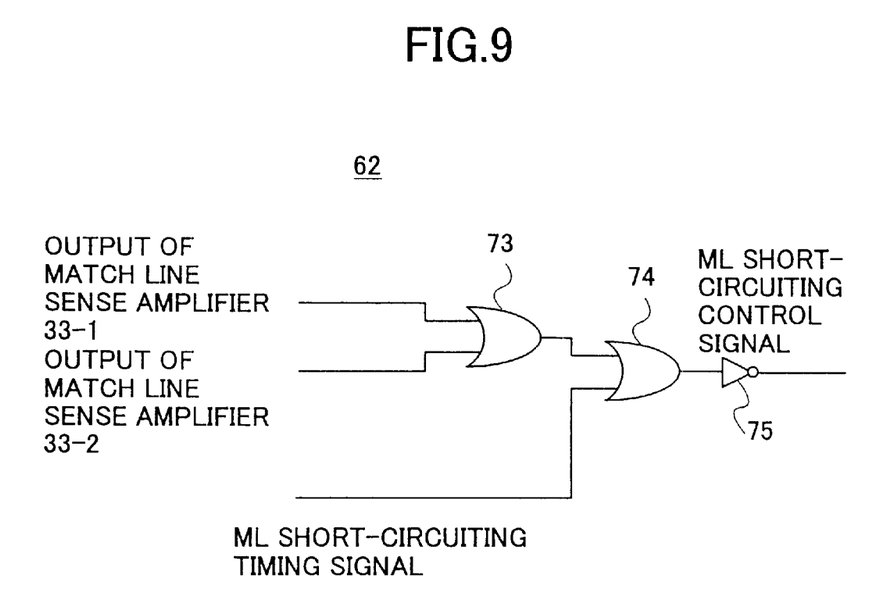
FIG. 9 is a circuit diagram of a circuit configuration of a short-circuiting control circuit.

FIG. 9 is a circuit diagram of a circuit configuration of the short-circuiting control circuit 62.

As shown in FIG. 9, the short-circuiting control circuit 62 includes OR circuits 73 and 74 and an inverter 75. The OR circuit 73 receives an output of the match line sense amplifier 33-1 and an output of the match line sense amplifier 33-2. If the corresponding match lines ML show a mismatch in both of the CAM cell arrays 31-1 and 31-2, the outputs of the match line sense amplifiers 33-1 and 33-2 are both LOW. The ML short-circuiting timing signal supplied from the timing generating circuit 63 becomes LOW at the timing at which a short-circuiting operation is to be performed. When this signal becomes LOW, the OR circuit 74 allows the output of the OR circuit 73 to pass therethrough. Accordingly, the output of the OR circuit 74 is LOW when the relevant match lines ML show a mismatch in both of the CAM cell arrays 31-1 and 31-2, resulting in the output of the inverter 75 being HIGH. The output of the inverter 75 is supplied to the ML short-circuiting circuit 61 of FIG. 8 as the ML short-circuiting control signal.

Figure 10:
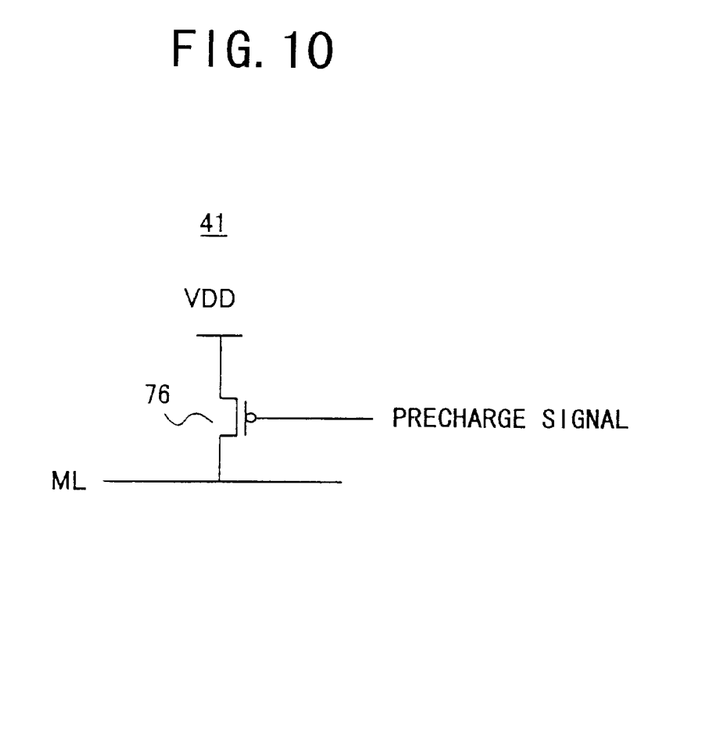
FIG. 10 is a circuit diagram showing a circuit configuration of a match line precharge circuit.

FIG. 10 is a circuit diagram showing a circuit configuration of the match line precharge circuit 41.

As shown in FIG. 10, the match line precharge circuit 41 includes a PMOS transistor 76. The PMOS transistor 76 has a gate thereof that receives a precharge signal (negative logic) indicative of a precharge operation. When the precharge signal becomes LOW, the PMOS transistor 76 becomes conductive, so that the match line ML is precharged to the power supply potential VDD.

Figure 11:
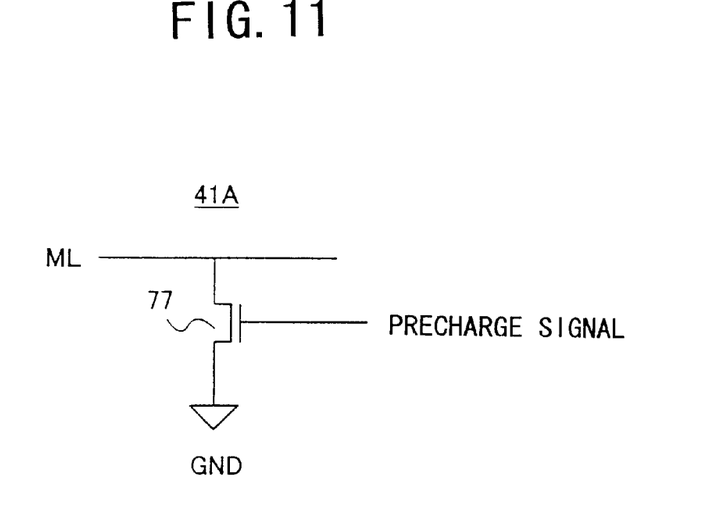
FIG. 11 is a circuit diagram showing a circuit configuration of another match line precharge circuit.

FIG. 11 is a circuit diagram showing a circuit configuration of the match line precharge circuit 41A.

As shown in FIG. 11, the match line precharge circuit 41A includes an NMOS transistor 77. The NMOS transistor 77 has a gate thereof that receives a precharge signal (positive logic) indicative of a precharge operation. When the precharge signal becomes HIGH, the NMOS transistor 77 becomes conductive, so that the match line ML is precharged to the ground potential GND.

Figure 12:
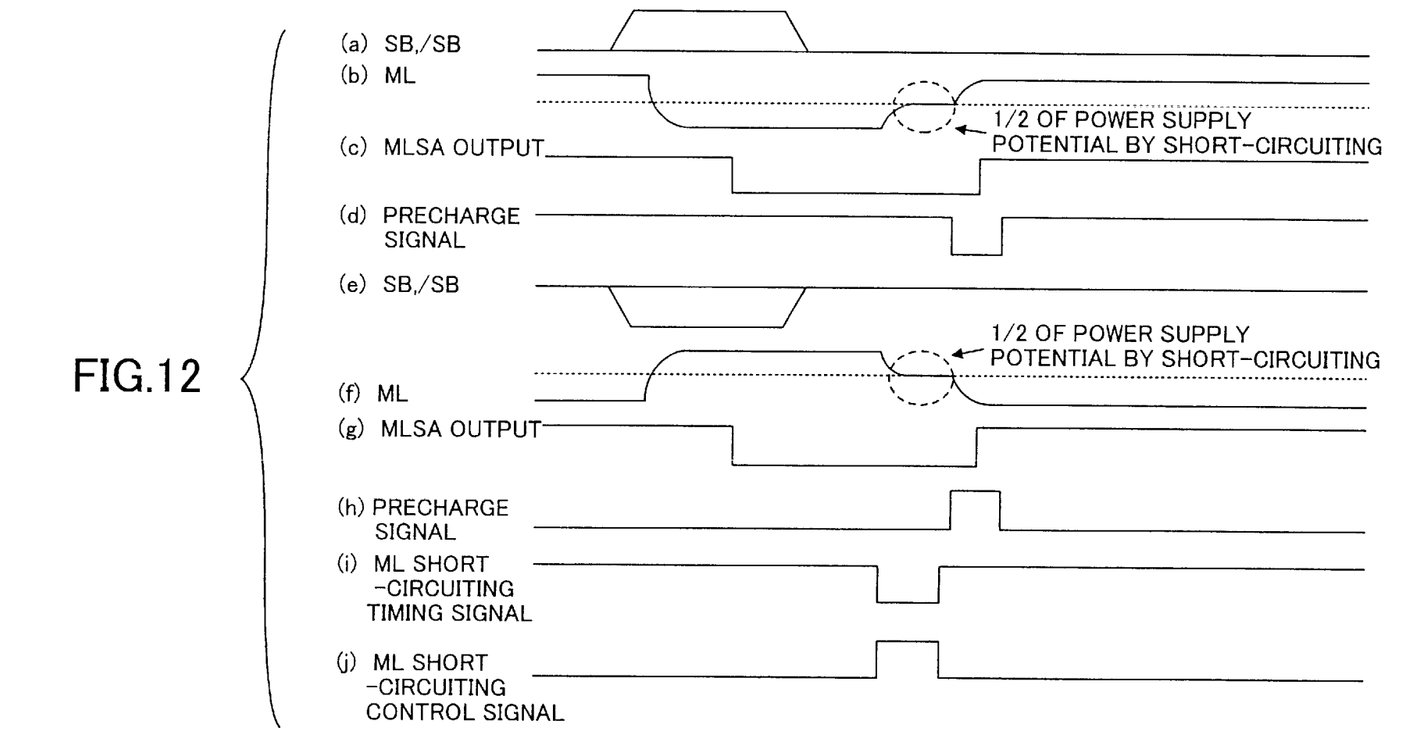
FIG. 12 is a signal waveform chart showing a short-circuiting operation and a precharge operation of the content addressable memory device according to the present invention.

FIG. 12 is a signal waveform chart showing a short-circuiting operation and a precharge operation of the content addressable memory device according to the present invention.

In FIG. 12, a letter designation (a) indicates a data waveform (entry key) of a search bus SB and /SB, and a letter designation (b) shows a signal waveform of a match line ML. A letter designation (c) illustrates an output of the match line sense amplifier 33-1, and (d) demonstrates a precharge signal. The signals described above are those relating to the CAM cell array 31-1. A letter designation (e) indicates a data waveform (entry key) of a search bus SB and /SB, and a letter designation (f) shows a signal waveform of a match line ML. A letter designation (g) illustrates an output of the match line sense amplifier 33-2, and (h) demonstrates a precharge signal. The signals described above are those relating to the CAM cell array 31-2. Further, a letter designation (i) shows the ML short-circuiting timing signal generated by the timing generating circuit 63, and a letter designation (j) illustrates the ML short-circuiting control signal generated by the short-circuiting control circuit 62.

As shown in FIG. 12, the search buses SB and /SB are driven as the search starts, resulting in an entry key appearing on the buses. If the entry key and entry data are not the same, the potential of the match line ML is brought down toward the ground potential from the HIGH precharge potential in the CAM cell array 31-1 (FIG. 12-(b)). In the CAM cell array 31-2, the match line ML is pulled up from the LOW precharge potential toward the power supply potential (FIG. 12-(f)). The potential of each match line ML is detected, and the detected result appears as an output of the match line sense amplifier as shown in FIGS. 12-(c) and (g).

After this, the ML short-circuiting timing signal indicative of a short-circuiting operation becomes LOW as shown in FIG. 12-(i). As was described in connection with FIG. 9, the ML short-circuiting control signal becomes HIGH in response to the outputs of the match line sense amplifiers indicative of mismatch determinations in both of the CAM cell arrays 31-1 and 31-2 and also in response to the ML short-circuiting timing signal that is LOW. As the ML short-circuiting control signal becomes HIGH, the match lines ML are short-circuited between the CAM cell array 31-1 and the CAM cell array 31-2, thereby being set to the midlevel potential (½ of the power supply potential) (FIGS. 12-(b) and (f)). Thereafter, the match lines ML are precharged to respective predetermined potentials (HIGH potential or LOW potential) in response to the respective precharge signals (negative logic or positive logic).

As described above, compared with the electric power necessary for a conventional precharge operation, the present invention requires ¼ as much electric power for the precharge operation and ½ as much electric power for a mismatch determination during one cycle of operations. Accordingly, one cycle of operations can be performed by spending only ¾ as much electric power as the conventional precharge operation.

Further, the present invention is not limited to these embodiments, but various variations and modifications may be made without departing from the scope of the present invention.

The present application is based on Japanese priority application No. 2001-163253 filed on May 30, 2001, with the Japanese Patent Office, the entire contents of which are hereby incorporated by reference.

What is claimed is:

1. A content addressable memory device, comprising:

a first match line which is a first one of two portions into which a whole match line corresponding to a single item of entry data is divided, and changes from a first potential to a second potential when corresponding entry data does not match an entry key;

a second match line which is a second one of the two portions into which the whole match line corresponding to the single item of entry data is divided, and changes from a second potential to a first potential when corresponding entry data does not match an entry key;

a first precharge circuit which precharges said first match line to the first potential;

a second precharge circuit which precharges said second match line to the second potential; and a short-circuiting circuit which short-circuits said first match line and said second match line with each other prior to precharging by the first and second precharge circuits if both of the first and second match lines indicate a mismatch.

2. The content addressable memory device as claimed in claim 1, further comprising:

a first cell array which is comprised of first-type cells; and a second cell array which is comprised of second-type cells, wherein said first match line is connected to said first cell array, and said second match line is connected to said second cell array.

3. The content addressable memory device as claimed in claim 1, wherein said first precharge circuit precharges said first match line to a power supply potential that is the first potential, and said second precharge circuit precharges said second match line to a ground potential that is the second potential.

4. The content addressable memory device as claimed in claim 1, further comprising:

a first sense amplifier which detects a potential of said first match line;

a second sense amplifier which detects a potential of said second match line; and a short-circuiting control circuit which drives said short-circuiting circuit according to outputs of said first sense amplifier and said second sense amplifier.

5. The content addressable memory device as claimed in claim 4, further comprising a timing generating circuit which controls an operation timing of said short-circuiting control circuit.

6. A content addressable memory device, comprising:

first and second match lines which correspond to two respective portions into which a whole match line corresponding to a single item of entry data is divided, and are precharged to first and second potentials, respectively; and a short-circuiting circuit which short-circuits said first and second match lines with each other prior to precharging if the first match line is at the second potential and the second match line is at the first potential.

7. The content addressable memory device as claimed in claim 6, further comprising:

a first precharge circuit which precharges the first match line to the first potential;

a second precharge circuit which precharges the second match line to the second potential;

a plurality of cells which are connected to the first match line, and change the first match line to the second potential in response to a mismatch between an entry key and entry data; and a plurality of cells which are connected to the second match line, and change the second match line to the first potential in response to a mismatch between an entry key and entry data.

8. A method of precharging a content addressable memory, comprising the steps of:

precharging a first match line to a first potential, the first match line corresponding to a first portion of entry data;

precharging a second match line to a second potential, the second match line corresponding to a second portion of the entry data;

changing the first match line from the first potential to the second potential in response to a mismatch between a first portion of an entry key and the first portion of the entry data;

changing the second match line from the second potential to the first potential in response to a mismatch between a second portion of the entry key and the second portion of the entry data;

short-circuiting the first match line and the second match line with each other if the first match line is at the second potential and the second match line is at the first potential;

precharging to the first potential the first match line that is at a midlevel potential between the first potential and the second potential after the short-circuiting; and precharging to the second potential the second match line that is at the midlevel potential after the short-circuiting.

* * * * *